(12) United States Patent
Pelletier et al.

(10) Patent No.: US 10,228,009 B2
(45) Date of Patent: Mar. 12, 2019

(54) VENT FOR PORTABLE ELECTRONICS COMBINED WITH ENCLOSURE MOUNTING FASTENER

(71) Applicant: Apple Inc., Cupertino, CA (US)

(72) Inventors: David M Pelletier, Cupertino, CA (US); William C. Lukens, San Francisco, CA (US); Eugene Fox, San Jose, CA (US)

(73) Assignee: Apple Inc., Cupertino, CA (US)

( * ) Notice: Subject to any disclaimer, the term of this patent is extended or adjusted under 35 U.S.C. 154(b) by 192 days.

(21) Appl. No.: 15/172,089

(22) Filed: Jun. 2, 2016

(65) Prior Publication Data

US 2017/0086317 A1 Mar. 23, 2017

Related U.S. Application Data

(60) Provisional application No. 62/221,267, filed on Sep. 21, 2015.

(51) Int. Cl.

| F16B 33/00 | (2006.01) |
| G06F 1/16 | (2006.01) |
| G06F 1/18 | (2006.01) |
| H04M 1/02 | (2006.01) |
| H05K 5/02 | (2006.01) |

(52) U.S. Cl.
CPC .......... *F16B 33/004* (2013.01); *G06F 1/1656* (2013.01); *G06F 1/182* (2013.01); *H04M 1/0202* (2013.01); *H05K 5/0213* (2013.01)

(58) Field of Classification Search
CPC .. H05K 5/0213; H05K 5/0239; H05K 5/0086; H05K 1/0202; F16B 33/004; G06F 1/1656; G06F 1/182; H04M 1/0202
See application file for complete search history.

(56) References Cited

U.S. PATENT DOCUMENTS

| 3,457,573 | A | | 7/1969 | Patyna et al. | |
| 5,051,323 | A | * | 9/1991 | Murphy | H01M 2/0421 429/165 |
| 7,585,211 | B2 | | 9/2009 | Qualy et al. | |
| 8,635,894 | B2 | | 1/2014 | Christ | |
| 2006/0046635 | A1 | * | 3/2006 | Gonya | H05K 5/0213 454/339 |
| 2010/0329602 | A1 | * | 12/2010 | Shah | G01D 5/35303 385/13 |
| 2014/0130957 | A1 | * | 5/2014 | Verdier | F16B 39/225 156/91 |

* cited by examiner

*Primary Examiner* — Dimary Lopez Cruz
*Assistant Examiner* — Ingrid Wright
(74) *Attorney, Agent, or Firm* — Dickinson Wright RLLP

(57) ABSTRACT

Fasteners and fastener systems that can act as air vents for enclosures are described. The fasteners can be configured to secure a component to a wall of an enclosure, while at the same time providing a passageway for air to pass between an internal cavity of the enclosure and an outer environment. The venting feature of the fastener can serve to equalize pressures between the internal cavity and outer environment so as to prevent pressure build up or condensation within the internal cavity. The dual functionality of the fasteners is suitable for use in portable electronic devices where compactness and space saving measures can be of importance.

20 Claims, 12 Drawing Sheets

VENT FOR PORTABLE ELECTRONICS COMBINED WITH ENCLOSURE MOUNTING FASTENER

CROSS REFERENCE TO RELATED APPLICATION

This application claims the benefit of priority under 35 U.S.C § 119(e) to U.S. Provisional Application No. 62/221,267, entitled "VENT FOR PORTABLE ELECTRONICS COMBINED WITH ENCLOSURE MOUNTING FASTENER," filed on Sep. 21, 2015, which is incorporated by reference herein in its entirety.

FIELD

The described embodiments relate generally to venting features for enclosures of electronic devices. More particularly, the present embodiments relate to the combination of fastening components and air vents for enclosures of electronic devices.

BACKGROUND

Portable consumer electronic devices can be exposed to various liquids from splashes, spills, submersion or even perspiration from user. To address these issues, manufactures often design the enclosures with waterproof features, such as sealants and gaskets around buttons, switches, moving parts and parting lines of the enclosures.

One of the consequences of providing a waterproof seal, however, is that the water-tight seal can also create an air-tight seal that prevents air from passing between an internal cavity that houses internal components and the external environment. Over time, this can create pressure differences between the internal cavity and external environment. In turn, this can create pressure build-up within the enclosure that could potentially affect the structural integrity of the enclosure. Additionally, any moisture trapped within the internal cavity can condense onto internal electronic components, causing shorting and malfunction of the electronic device. What is needed, therefore, are waterproof enclosure designs that allow for venting and equalizing of air pressures, especially within the confined small spaces of many modern portable electronic devices.

SUMMARY

This paper describes various embodiments that relate to air vent features for enclosures. In particular embodiments, the air vents are incorporated into fasteners that secure components to enclosures. This provides a compact and modular air vent design suitable for small enclosures such as those for small form factor portable electronic devices.

According to one embodiment, an electronic device is described. The electronic device includes an enclosure defining an internal cavity and having an opening that passes through a wall of the enclosure. The electronic device also includes a fastener positioned within the opening. The fastener is configured to couple a component to the enclosure. The fastener providing a passageway for passage of air between the internal cavity and an external environment.

According to another embodiment, a method of coupling a component to an enclosure for an electronic device is described. The method includes positioning a seal element within an opening of the enclosure. The opening is formed through a wall of the enclosure. The method also includes positioning a fastener within the opening such that the fastener secures the component to the enclosure. The fastener applies a compression force on the seal element such that the seal element prevents entry of liquid to an internal cavity of the enclosure. The fastener provides a passageway for air to pass between the internal cavity and an external environment.

According to a further embodiment, an enclosure for an electronic device is described. The enclosure includes a wall. The wall includes a through-hole that passes through an exterior surface and an interior surface of the wall. The wall also includes a partial hole that passes through the interior surface and not through the exterior surface of the enclosure. The through-hole and partial hole are connected by a channel that gives the partial hole access to an external environment. The enclosure further includes a fastener positioned within the partial hole. The fastener is configured to secure a component to the wall. The fastener provides a passageway for air to pass between the internal cavity and the external environment via the partial hole and the through hole.

These and other embodiments will be described in detail below.

BRIEF DESCRIPTION OF THE DRAWINGS

The disclosure will be readily understood by the following detailed description in conjunction with the accompanying drawings, wherein like reference numerals designate like structural elements.

DETAILED DESCRIPTION

Figure 1:
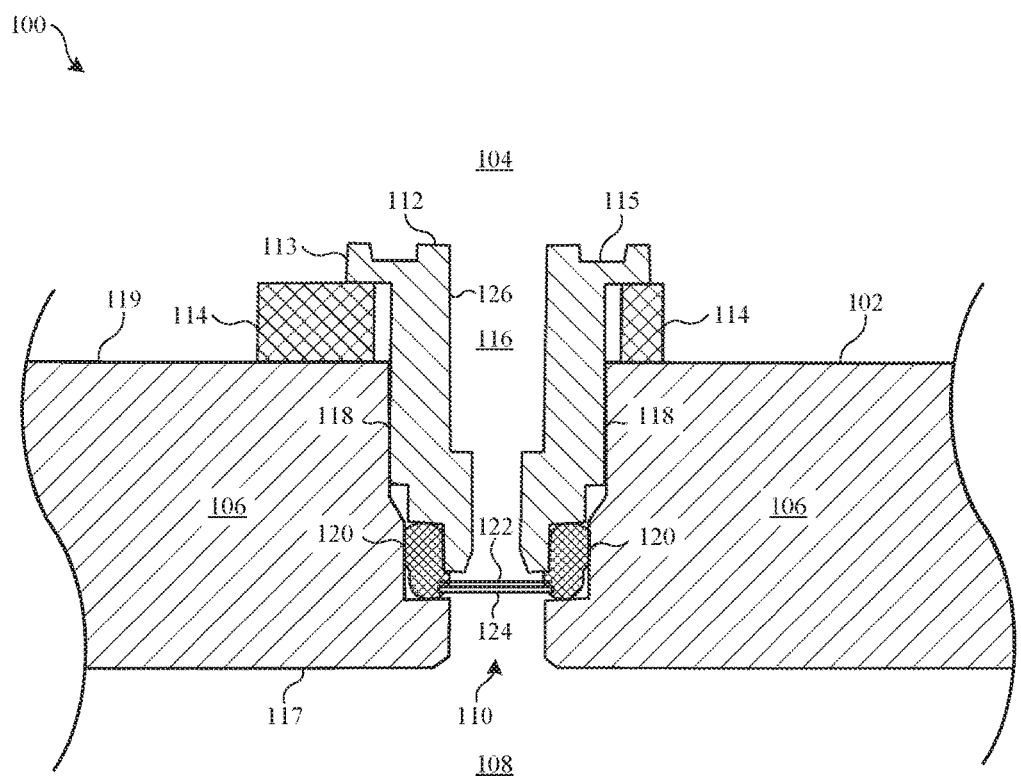
FIG. 1 shows a cross-section view of an electronic device that includes a vent fastener.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

The following disclosure relates to venting features for enclosures and housing for electronic devices. A vent, corresponding to an opening within an enclosure of an electronic device, can allow air to flow between an internal cavity and an external environment, thereby equalizing the pressure there between. The vent can be located within a fastener used to couple a component to the enclosure, thereby combining functions of the fastener. In some cases, the vent corresponds to a hole or channel formed lengthwise through the fastener. The combined function of the fastener as a coupling device and as a vent can save space within the electronic device and modularize the vent, allowing for easy access and replacement of the vent fastener. The fastener can be a screw, a press-fit insert, pin, or any other suitable fastener type.

In some embodiments, the fastener is positioned within an opening of a wall of the enclosure such that the fastener can be easily removed and reinstalled in the enclosure. A seal or gasket can be positioned between the fastener and the enclosure to prevent liquid from entering into the internal cavity of the enclosure. In some embodiments, the seal is in the form of an O-ring or other type of compression gasket that is compressed between the fastener and the enclosure, radially sealing the fastener within the opening of the wall.

In some embodiments, an air-permeable membrane is used in conjunction with the vent to prevent water and other liquids from passing through the vent and intruding into the internal cavity of the electronic device. The membrane can be waterproof, i.e., made of a hydrophobic material, which wicks away water, further inhibiting intrusion of water and moisture. The membrane can be a permanent feature of the fastener or designed to be removably coupled to the fastener. In some embodiments, a cosmetic layer or mesh is used to cover the membrane for aesthetic appeal.

The fastener can be used to couple any suitable component to the enclosure. In some embodiments, the fastener is used to couple an internal component, such as a speaker, internal button component, or sensor, to a wall within the internal cavity of the enclosure. In some embodiments, the fastener is used to couple an external component, such as a display component, button, or cosmetic feature, to the enclosure.

The vent features described herein are well suited for implementation with consumer products. For example, the vent features can be used in the design and manufacture of housings and enclosures for portable electronic devices (e.g., mobile phones, wearable electronics, media players, and tablet computers), desktop or larger computers, and electronic device accessories, such as those manufactured by Apple Inc., based in Cupertino, Calif.

These and other embodiments are discussed below with reference to FIGS. 1-11. However, those skilled in the art will readily appreciate that the detailed description given herein with respect to these Figures is for explanatory purposes only and should not be construed as limiting.

FIG. 1 illustrates a cross-section view of a portion of electronic device 100 that includes a vent in accordance with some embodiments. In some embodiments, electronic device 100 corresponds to a portable electronic device, such as a wearable electronic device (e.g., electronic watch), portable phone, or tablet computer. Electronic device 100 includes enclosure 102, which defines internal cavity 104 that is configured to house internal electronic components such as an integrated circuit, battery, sensors, antenna, display module, etc. Enclosure 102 includes enclosure wall 106, which serves as a boundary between internal cavity 104 and external environment 108. Enclosure wall 106 has opening 110 that extends through enclosure wall 106, thereby providing a passageway between internal cavity 104 and external environment 108. Thus, opening 110 can be referred to as a through-hole.

Fastener 112 is designed to fit within opening 110 and secure component 114 to enclosure 102. Fastener 112 can correspond to a screw, bolt, nut, press-fit insert or snap-fit insert. Fastener 112 includes shaft 118, which is positioned within opening 110, and flange 113, which protrudes from shaft 118. Flange 113 can engage with component 114 and can act as a screw head that aids in the turning of fastener 112 if fastener 112 is a screw. In some embodiments, flange 113 includes features 115, such as indentations, that can mate with a tool to aid insertion and removal of fastener 112 within opening 110. Fastener 112 can be any suitable type of fastener and can be made of any suitable material. In some embodiments, fastener 112 is a screw that has threads formed along an exterior surface of shaft 118 of fastener 112. In this case, enclosure wall 106 within opening 110 will have corresponding threads that engage with the threads of fastener 112. In other embodiments, fastener 112 is a press-fit insert or snap-fit that does not have threads. A press-fit insert or snap-fit insert may be desirable if enclosure wall 106 is made of a material that is too brittle or compressible for forming adequate threads.

The material of fastener 112 can be chosen based on any of a number of factors, such as tensile strength, electrical conductivity, thermal conductively, and/or corrosion resistance. In some embodiments, fastener 112 is made of a metal material, such as stainless steel or aluminum alloy. In other embodiments, fastener 112 is made of a plastic material. In some embodiments, fastener 112 is made of both metal and plastic. The shape of fastener 112 can vary depending on design choice. In some embodiments, shaft 118 has a cylindrical shape (round cross-section) corresponding to a cylindrically shaped opening 110. In other embodiments, shaft 118 has a polygonal cross-section (e.g., square cross-section).

Component 114 can correspond to any suitable electronic or non-electronic component. In a particular embodiment, component 114 is a speaker that creates audible sound for a user of electronic device 100 to hear. Alternatively, component 114 can be a button assembly, sensor, battery, antenna, printed circuit board, camera, or any other suitable internal component. In some embodiments, fastener 112 is configured to couple more than one component 114 to enclosure 102. In the embodiment shown in FIG. 1, fastener 112 is configured to secure component 114 to internal surface 119 of enclosure wall 106 such that component 114 is within internal cavity 104 of enclosure 102. It should be noted, however, that in other embodiments fastener 112 is configured to secure component 114 to external surface 117 of enclosure wall 106.

In addition to fastening component 114 to enclosure 102, fastener 112 also includes vent 116, which corresponds to an opening within fastener 112 defined by interior surface 126. Vent 116 acts as a channel for air to flow between internal cavity 104 and external environment 108. This allows for pressure equalization between internal cavity 104 and external environment 108, thereby preventing pressure build-up within internal cavity 104 as electronic device 100 experiences temperature changes during normal use of electronic device 100. Vent 116 can also prevent condensation on electrical components within internal cavity 104 that could cause electrical shorts and malfunction of electronic device 100. Furthermore, the flow of air between internal cavity 104 and external environment 108 can act as a passive cooling mechanism for cooling electronic components, such as integrated circuits, that may be housed within enclosure 102. Because of the multiple function of fastener 112 as a coupling agent and a vent, fastener 112 can be referred to as a vent fastener.

Note that in the embodiment of FIG. 1, vent 116 runs axially through the length of shaft 118 of fastener 112 and concentric with shaft 118. However, vent 116 can be positioned in any location within fastener 112. For example, vent 116 can be offset with respect to an axial center of fastener 112. Furthermore, vent 116 can have any suitable shape and size. In some embodiments, vent 116 has round cross-section shape, while in other embodiments vent 116 has a polygonal cross-section shape.

In some embodiments, seal element 120 is positioned between fastener 112 and enclosure wall 106. Seal element 120 can be an O-ring or other type of compression gasket that radially surrounds fastener and creates a liquid-tight seal, thereby preventing liquid from entering between fastener 112 and enclosure wall 106 and into internal cavity 104. In some embodiments, seal element 120 is in the form of an adhesive or polymer material that can be applied in liquid form, or an adhesive tape. Seal element 120 can be made of any suitable material, such as compressible silicone, polymer or rubber compositions. As seal element 120 wears during normal use, fastener 112 can be removed from opening 110 allowing access to seal element 120 for replacement.

In some embodiments, membrane 122 is positioned within the airflow pathway between internal cavity 104 and external environment 108. Membrane 122 is designed to allow passage of air while blocking liquids, such as water, oil and grease. In this way, membrane 122 can be referred to as a semipermeable membrane or air-permeable membrane. If seal element 120 creates an airtight seal between fastener 112 and enclosure wall 106, any air entering or exiting internal cavity 104 is forced to pass though vent 116 and membrane 122, unless enclosure 102 includes other opening that allow air to pass between internal cavity and external environment.

Membrane 122 can be made of any suitable material. In some embodiments, membrane 122 is made of a hydrophobic material (e.g., waterproof or water resistant material) in the form of a mesh having very small holes. The hydrophobic material can include, for example, a fluoropolymer material (e.g., polytetrafluoroethylene) that wicks away water and moisture, further deterring the water and moisture from entering into internal cavity 104. In some embodiments, cosmetic mesh 124 is positioned between membrane 122 and external environment 108 to cover and hide membrane 122 from view of a user. For example, cosmetic mesh 124 may have a dark color (e.g., black) to cover a white or light colored membrane 122. In some embodiments, cosmetic mesh 124 can also serve to protect membrane 122 from being punctured—in which case cosmetic mesh 124 can be made of a durable and puncture resistance material. Note that membrane 122 and/or cosmetic mesh 124 can be positioned in any suitable location within the airflow passageway between internal cavity 104 and external environment 108 and that FIG. 1 only shows one possible arrangement. For example, membrane 122 and/or cosmetic mesh 124 can be positioned within fastener 112 and/or opening 110 of enclosure wall 106 instead of on or proximate to seal element 120.

Since vent 116 is positioned within fastener 112, this saves valuable space within internal cavity 104. In particular, there is no need to provide room for another opening in a separate location along enclosure wall 106 for a separate vent. Providing more openings within enclosure wall 106 could also negatively affect the structural integrity as well as the aesthetic appeal of enclosure wall 106. Another advantage to combining vent 116 with fastener 112 is that the presence of fastener 112 within opening 110 can buttress this region of enclosure wall 106 around opening 110. That is, opening 110 without fastener 112 positioned therein may impair the structural soundness of enclosure wall 106. Fastener 112 can ameliorate this problem or even improve the soundness of enclosure wall 106 around opening 110.

Figure 2:
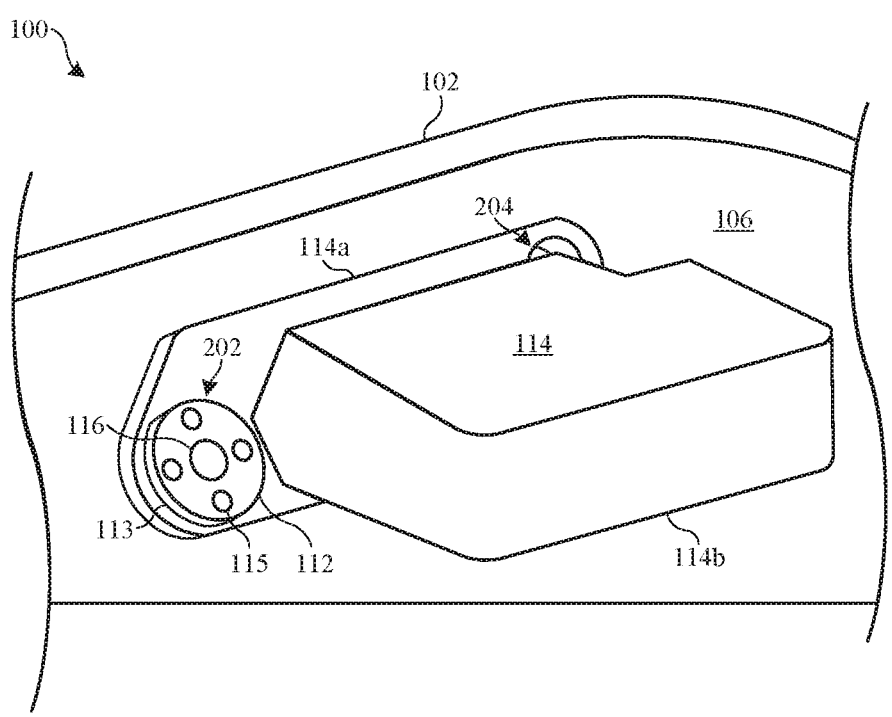
FIG. 2 shows a perspective internal view of the enclosure shown in FIG. 1.

FIG. 2 illustrates a perspective internal view of a portion of enclosure 102 of electronic device 100. In this view, an opposing side of fastener 112 and component 114 are shown. As shown, component 114 can include bracket portion 114a and main portion 114b. Fastener 112 can be positioned within a first hole 202 of bracket portion 114a such that flange 113 engages with bracket portion 114a to secure component 114 to enclosure wall 106. Vent 116 provides a channel for air to pass between opposing sides of enclosure wall 106. In some embodiments, bracket portion 114a includes second hole 204 for second fastener (not shown) to fully secure component 114 to enclosure wall 106. In some embodiments, the second fastener includes a vent similar to fastener 112. In other embodiments, the second fastener does not include a vent. If fastener 112 is a screw, features 115 can be used as engagement members for aiding rotation of fastener 112 for inserting and removing fastener 112 into and out of first hole 202.

Figure 3:
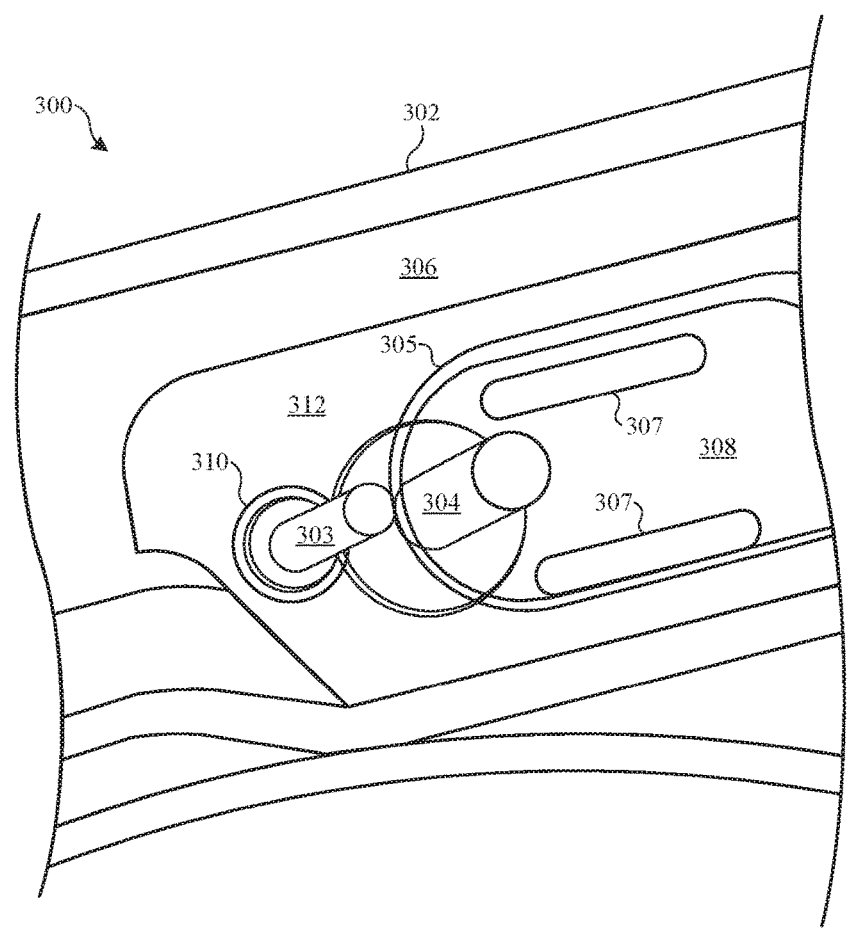
FIG. 3 illustrates a perspective internal view of an enclosure showing how to form a through-hole and a partial hole create a hidden opening for a vent fastener.
Figure 4:
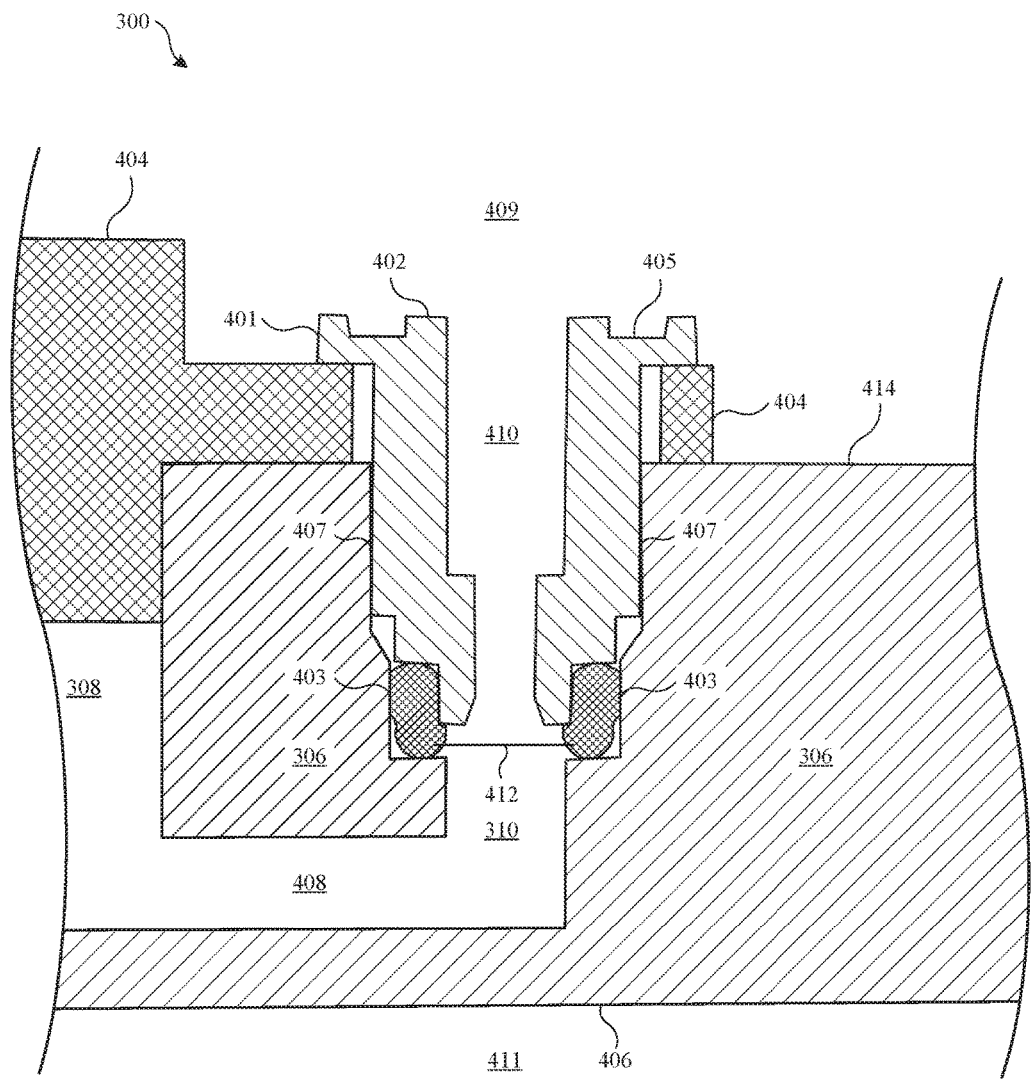
FIG. 4 shows a cross-section view of the enclosure shown in FIG. 3 after assembly of the vent fastener and a component.

In some embodiments, the opening within an enclosure wall to accommodate the fastener is hidden from view of a user. One such embodiment is shown in FIGS. 3 and 4, which illustrate perspective and cross-section views, respectively, of electronic device 300. FIG. 3 shows a perspective view of an internal portion of enclosure 302 of electronic device 300, prior to assembly of a component a fastener. Note that a portion of enclosure wall 306 is illustrated as transparent such that first cutting tool 303 and second cutting tool 304 can be viewed. First and second cutting tools 302 and 304 can correspond to "t-cutters" that can be operated by computer numerical code (CNC).

Large opening 305 is formed through an interior surface of enclosure wall 306, but not all the way through enclosure wall 306 (i.e., not through an exterior surface of enclosure wall 306). Large opening 305 forms pocket 308, which is configured to accommodate a component (not shown). Openings 307 are formed within pocket 308 and through enclosure wall 306, and therefore can be referred to as through-holes. Openings 307 allow access to a component within enclosure 302. For example, openings 307 can allow sound from a speaker component to pass through enclosure wall 306. As another example, openings 307 can allow light from an external environment to reach a sensor component. It should be noted that any suitable number of openings 307 can be formed within enclosure 302, including only one opening or multiple openings. In addition, the shape of each of openings 307 can be of any suitable shape, including round, oblong (e.g., lozenge shaped) or polygonal shape.

First cutting tool 303 can be used to cut partial opening 310 (a.k.a., partial hole) through an interior surface of enclosure wall 306, but not all the way through of enclosure wall 306 (i.e., not through an exterior surface of enclosure wall 306). Partial opening 310 is configured to accommodate a fastener (not shown). Second cutting tool 304 can then be used to cut material between partial opening 310 and pocket 308, thereby creating a continuous channel from partial opening 310 to openings 307.

FIG. 4 shows a cross-section view of electronic device 300 after fastener 402 and component 404 are assembled on enclosure wall 306. As described above, component 404 can be any suitable functional component, such as a speaker that produces sound, a sensor that senses moisture or light, a light emitter that shines light, etc. As shown, partial opening 310 is formed through interior surface 414 but not through exterior surface 406 of enclosure wall 306. Partial opening 310 is connected to pocket 308 by channel 408, cut by second cutting tool 304 described above. Pocket 308, in turn, provides access to external environment 411 via openings 307 (shown in FIG. 3). Thus, air can pass through partial opening 310, channel 408, pocket 308 and gain access to external environment 411 by openings 307 (shown in FIG. 3).

Fastener 402 is positioned within partial opening 310 to couple component 404 to enclosure wall 306. In some embodiments, fastener 402 includes flange 401, which engages with component 404, and features 405, which aid insertion and removal of fastener 402 within partial opening 310. Fastener 402 can be a screw, where the exterior surface of shaft 407 includes threads that engage with corresponding threads of enclosure wall 306 within partial opening 310. Seal element 403, such as a compressible O-ring, can be used to provide a water resistance seal between fastener 402 and enclosure wall 306.

Fastener 402 includes vent 410, which corresponds to an opening within fastener 402. Membrane 412 can be a semipermeable membrane designed to allow passage of air while blocking liquids, such as water, oil and grease. This configuration provides a continuous channel for air to pass through fastener 402 between internal cavity 409 and external environment 411, allowing equalization of pressure of internal cavity 409 with external environment 411.

One of the advantages of the configuration of electronic device 300 is that a separate opening for a vent within exterior surface 406 of enclosure wall 306 is not required. That is, openings 307 serve to access component 404 as well as to access to vent 410. This minimizes the number of visible openings within enclosure wall 312, which can add to the cosmetic appeal of enclosure 302 and electronic device 300. In addition, since membrane 412 is within partial opening 310, it is not visible to a user and thus does not need to be covered with a cosmetic mesh.

Figure 5:
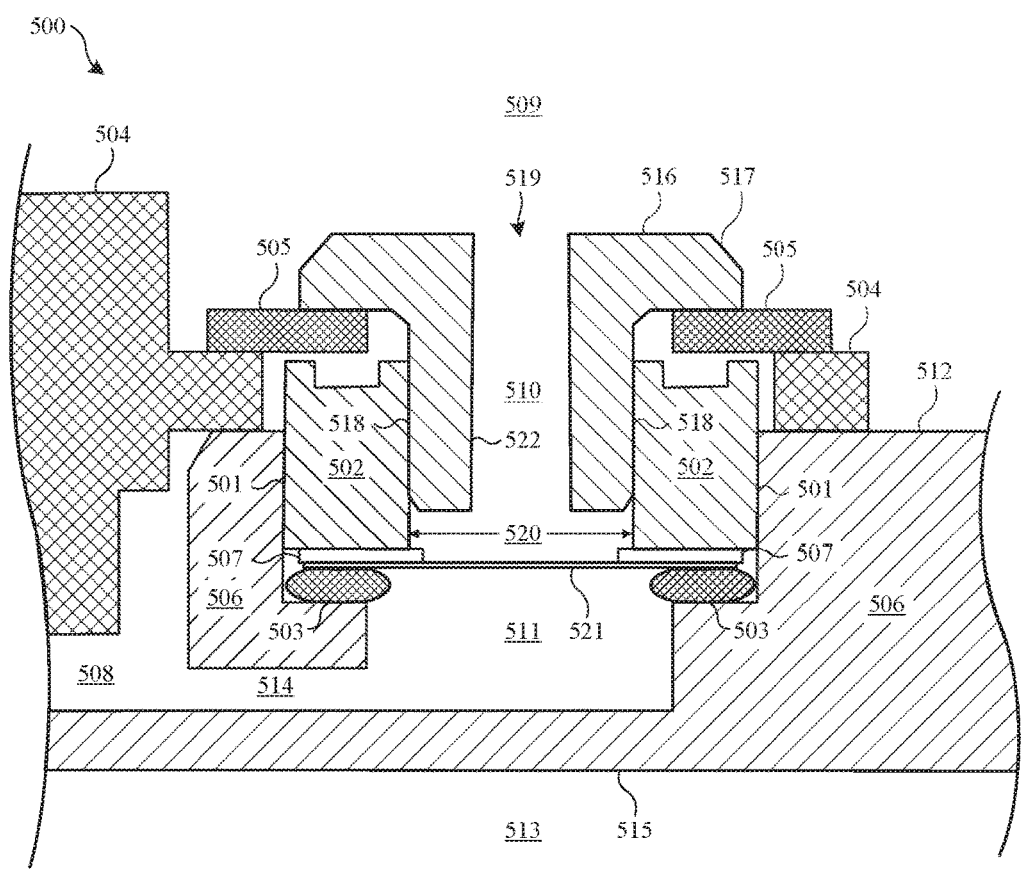
FIG. 5 shows a cross-section view of an enclosure that includes a fastener with an insert.

In some embodiments the fastener is configured to accommodate one or more inserts resulting in a stacked fastener configuration. FIG. 5 illustrates a cross-section view of a portion of enclosure wall 506 of electronic device 500, which includes insert 516 in accordance with some embodiments. Enclosure wall 506 includes partial opening 511, which is formed through interior surface 512 but not through exterior surface 515 of enclosure wall 506. Partial opening 511 is connected to pocket 508 by channel 514, which in turn provides access to external environment 513, similar to as described above with reference to FIGS. 3 and 4.

As shown, fastener 502 is positioned within partial opening 511. Fastener 502 can be a thread nut or screw, where exterior surface 501 of fastener 502 includes threads that engage with corresponding threads of enclosure wall 506 within partial opening 511. In other embodiments, fastener 502 is press-fit into partial opening 511. Seal element 503, such as a compressible O-ring, can be used to provide a water resistance seal between fastener 502 and enclosure wall 506. Membrane 521 can be a semipermeable membrane designed to allow passage of air while blocking liquids, such as water, oil and grease. In some embodiments, membrane 521 is attached to fastener 502 using adhesive 507, which can be a pressure sensitive adhesive.

Insert 516 is configured to fit within opening 520 of fastener 502, and engage with interior surface 518 of fastener 502. In some embodiments, insert 516 includes external threads that engage with interior surface 518 of fastener 502. In other embodiments, insert 516 does not include threads and is press-fit or snap-fit within opening 520 of fastener 502. As shown, insert 516 includes opening 519 that cooperates with opening 520 of fastener to create a vent 510, corresponding to a pathway for air to flow between internal cavity 509 and external environment 513, thereby allowing equalization of pressure of internal cavity 509 with external environment 513.

As shown, fastener 502 and insert 516 can cooperate to couple component 504 to enclosure wall 506. In some embodiments, insert 516 includes flange 517 that cooperates with second member 505—which can correspond to a bracket, washer or shim—to secure component 504 to enclosure wall 506. In other embodiments, second member 505 is not present. In some embodiments, rather than a washer or shim, second member 505 is another component internal to electronic device 500. This configuration of using fastener 502 and insert 516 can allow for the pressure used to couple component 504 to enclosure wall 506 to be separated from the pressure from fastener 502 used to press on seal element 503 to create a liquid-tight seal. That is, insert 516 can apply a first pressure to couple component 504 to enclosure wall 506, while fastener 502 can apply a second pressure, that can be different than the first pressure, to seal element 503. In this way, one of the advantages of using the stacked fastening configuration shown in FIG. 5 is that a pressure used to couple component 504 to enclosure wall 506 can be decoupled from a pressure used to compress seal element 503. It should be noted that insert 516 can be referred to as a fastener and fastener 502 can be referred to as an insert or adapter.

Another advantage of the stacked fastening configuration is that combining fastening features within one fastening assembly saves space within internal cavity 509. In some embodiments, interior surface 522 of insert 516 is configured to engage with a second insert (not shown) to couple a second component (not shown) to enclosure wall 506. For example, interior surface 522 can include threads configured to engage with exterior threads of the second insert. The second insert can, in turn, be configured to engage with third insert (not shown), and so on. This progression of inserts could continue until a final insert is placed within the stacked configuration. Any suitable number of inserts can be stacked depending on design requirements.

Figure 6:
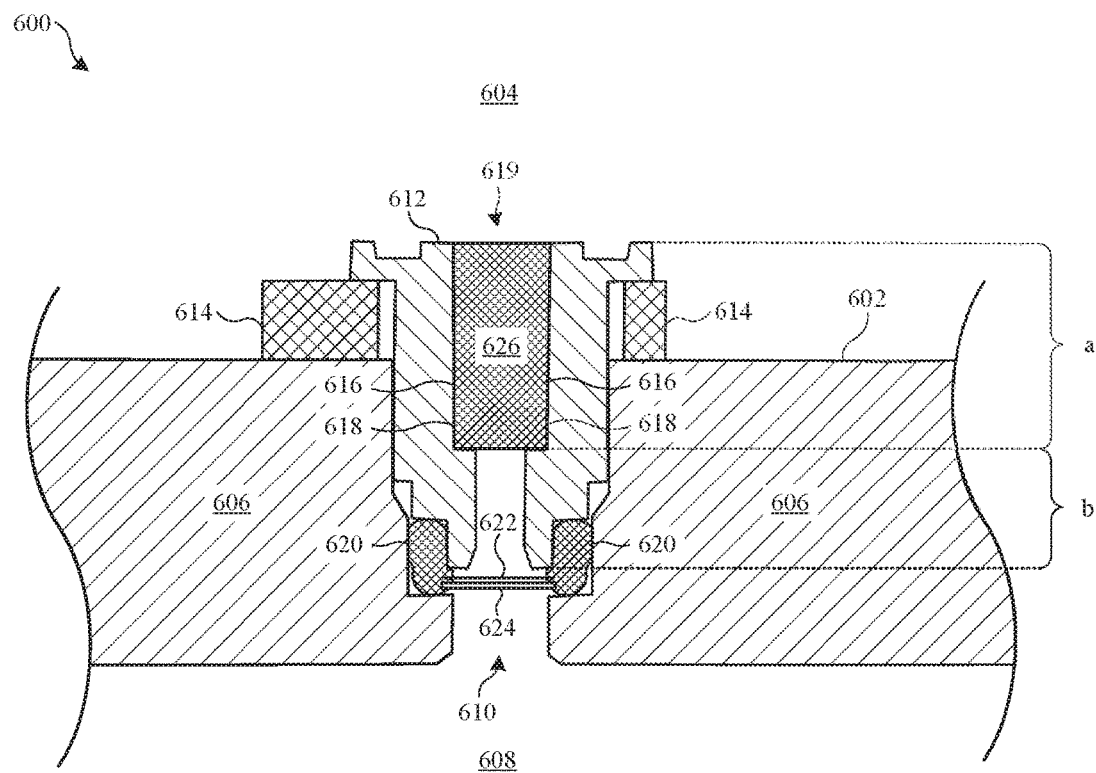
FIG. 6 shows a cross-section view of an enclosure that includes a fastener with an insert that includes a functional device.

In some embodiments, the insert serves a different function other than a venting feature. FIG. 6 illustrates a cross-section view of a portion of enclosure 602 of electronic device 600, according to one such an embodiment. Fastener 612 fits within opening 610 of enclosure wall 606, and is configured to couple component 614 to enclosure wall 606. In some embodiments, seal element 620 (e.g., compression gasket), membrane 622 and/or cosmetic mesh 624 are also positioned within opening 610.

Fastener 612 includes opening 619 that is configured to accept device 626. In some embodiments, exterior surface 616 of device 626 is threaded and engages with corresponding threads of interior surface 618 within opening 619 of fastener 612. In other embodiments, device 626 is configured to be press-fit within opening 619. In some embodiments, opening 619 is shaped to accept device 626. For example, opening 619 can include wide section a, which is shaped in accordance with device 626, and tapered section b. However, opening 619 can have any suitable shape and size.

Device 626 can correspond to any suitable functional device. For example, device 626 can correspond to a sensor (e.g., barometric, altimeter, pressure or chemical sensor) that can measure air pressure or quality from external environment 608. Alternatively or additionally, device 626 can correspond to a sensor/valve combination that closes any passageways in response to exposure to a predetermined amount of moisture. Alternatively or additionally, device 626 can correspond to a speaker that transmits sound to external environment 608, or a light that transmits light to external environment 608. For some of these embodiments, it may be beneficial to remove membrane 622 and/or cosmetic mesh 624. In some embodiments, additional devices (not shown) can be stacked within fastener 612. Since opening 610 within enclosure wall 606 is used to accommodate device 626, enclosure 102 may include different openings for accommodating one or more vent fasteners to equalize the pressures between internal cavity 604 and external environment 608, such as one or more of those described above with reference to FIGS. 1-5.

Figure 7A:
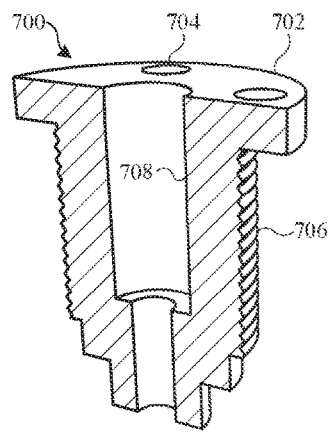
FIGS. 7A-7E show cross-section views of different fasteners having flanges.

FIGS. 7A-7E illustrate cross-section views of different vent fasteners, in accordance with some embodiments. FIG. 7A shows fastener 700, which includes flange 702 and features 704 used to aid assembly of fastener 700 within an opening of an enclosure wall. Fastener 700 includes exterior surface 706 that has threads and interior surface 708 that does not have threads. The threads at exterior surface 706 can engage with corresponding threads within the opening of the enclosure wall. In some embodiments, interior surface 708 engages with an insert by press-fit, welding or use of adhesive. In other embodiments, no insert is used and interior surface 708 does not engage with any insert.

Figure 7B:
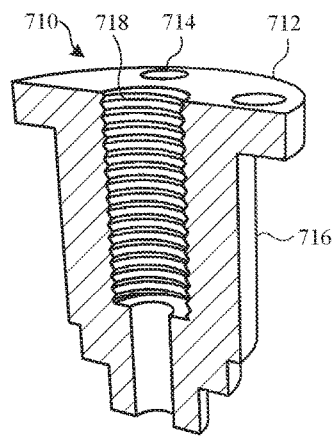
Figure 7C:
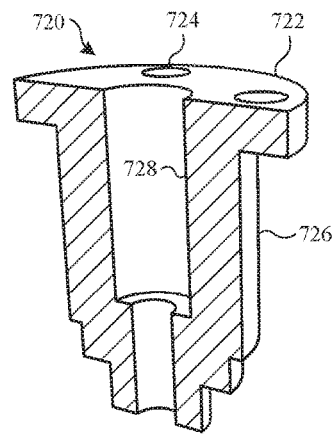

FIG. 7B shows fastener 710, which includes flange 712 and features 714. Exterior surface 716 is not threaded, and therefore can engage within an opening of an enclosure wall by press-fit, welding or by use of an adhesive. Interior surface 718 is threaded and can, therefore, threadably engage with an insert. FIG. 7C shows fastener 720, which includes flange 722 and features 724 for aiding insertion of fastener 720 in an enclosure wall. Exterior surface 726 is not threaded, and therefore can engage within an opening of an enclosure wall by press-fit, welding or by use of an adhesive. Interior surface 728 is also not threaded and can engage with an insert by press-fit, welding or adhesive. Alternatively, an insert may not be used and interior surface 728 does not engage with an insert.

Figure 7D:
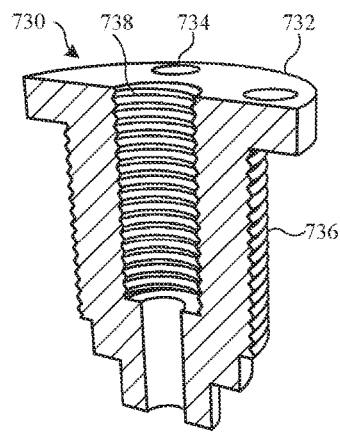
Figure 7E:
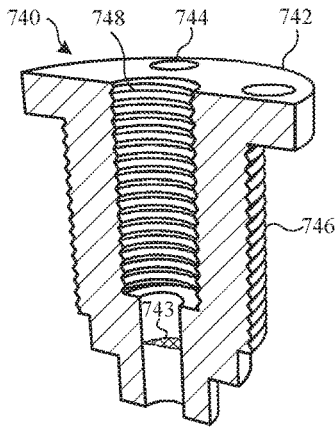

FIG. 7D shows fastener 730, which includes flange 732 and features 734. Both exterior surface 736 and interior surface 738 are threaded to engage with an enclosure wall and an insert, respectively. The threads of exterior surface 736 and interior surface 738 can have the same or different type of threading (e.g., lead, pitch, start). FIG. 7E shows fastener 740, which includes flange 742 and features 744. Both exterior surface 746 and interior surface 748 are threaded to engage with an enclosure wall and an insert, respectively. In addition, fastener 740 includes membrane 743, and optionally a cosmetic cover (not shown), positioned therein. Membrane 743 can be, for example, insert molded into fastener 740 if fastener 740 is made of a molded material. Membrane 743 can correspond to a material that allows air to flow but not liquid. Fastener 740 is presented to show that membrane 743 can be located in any suitable location, including within fastener 740, or outside of fastener 740, as described above with reference to FIGS. 1-6. Note that any of fasteners 700, 710, 720 and 730 can also include a membrane.

Figure 8A:
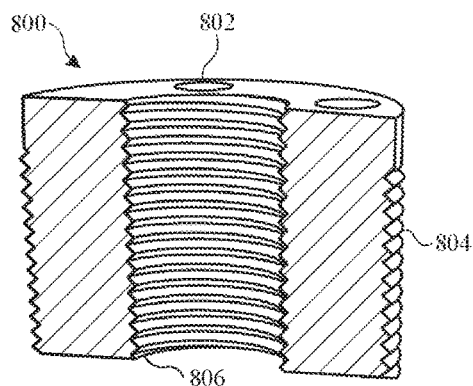
FIGS. 8A-8D show cross-section views of different fasteners without flanges.

FIGS. 8A-8D illustrate cross-section views of different vent fasteners that do not include a flange, in accordance with some embodiments. The fasteners of FIGS. 8A-8D can be used, for example, in the configuration described above with reference to FIG. 5 where the fastener cooperates with an insert to couple a component to an enclosure wall. FIG. 8A shows fastener 800 with features 802 that can be used to aid insertion of fastener 800 into an opening of an enclosure. Both exterior surface 804 and interior surface 806 are threaded to engage with an enclosure wall and an insert, respectively.

Figure 8B:
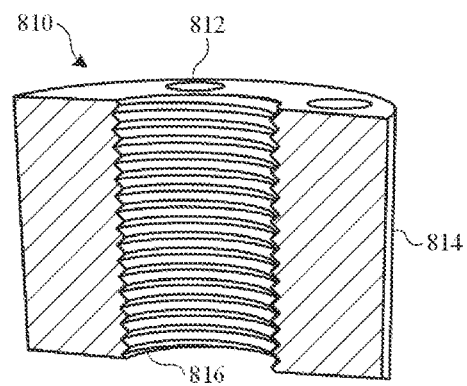
Figure 8C:
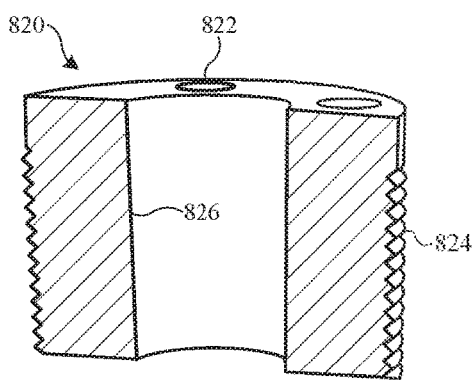
Figure 8D:
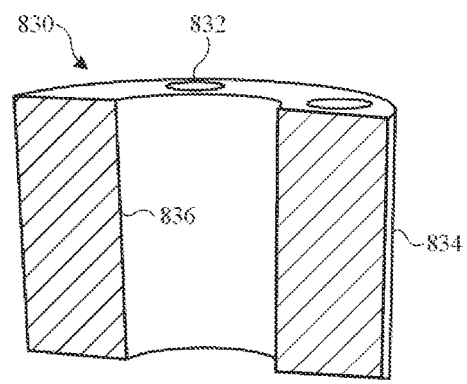

FIG. 8B shows fastener 810 with features 812 that can be used to aid insertion of fastener 810 into an opening of an enclosure. Exterior surface 814 does not have threads and can therefore engage within the opening of the enclosure wall by press-fit, welding or via an adhesive. Interior surface 816 is threaded to engage with a correspondingly threaded insert. FIG. 8C shows fastener 820 with features 822. Exterior surface 824 has threads to engage with corresponding threaded opening of an enclosure. Interior surface 826 does not have threads and can, therefore, engage within an insert by press-fit, welding or using an adhesive. FIG. 8D shows fastener 830 with features 832. Both exterior surface 834 and interior surface 836 do not have threads and can, therefore engage with an enclosure wall and an insert, respectively, by press-fit, welding or via an adhesive.

Note that the fasteners of FIGS. 7A-7E and 8A-8D are exemplary and do not limit other combinations and possibilities within the scope of the embodiments described herein. For example, any of fasteners 800, 810, 820 and 830 can also include a semi-permeable membrane and/or cosmetic mesh, as described above with reference to FIG. 7E. In addition, the shapes of the fasteners, including the shapes of interior and exterior surfaces, can vary depending on design requirements and are not limited to those shown in FIGS. 7A-7E and 8A-8D. Furthermore, in those fasteners with threads, the exterior and/or interior surfaces may be fully threaded or partially threaded.

Figure 9:
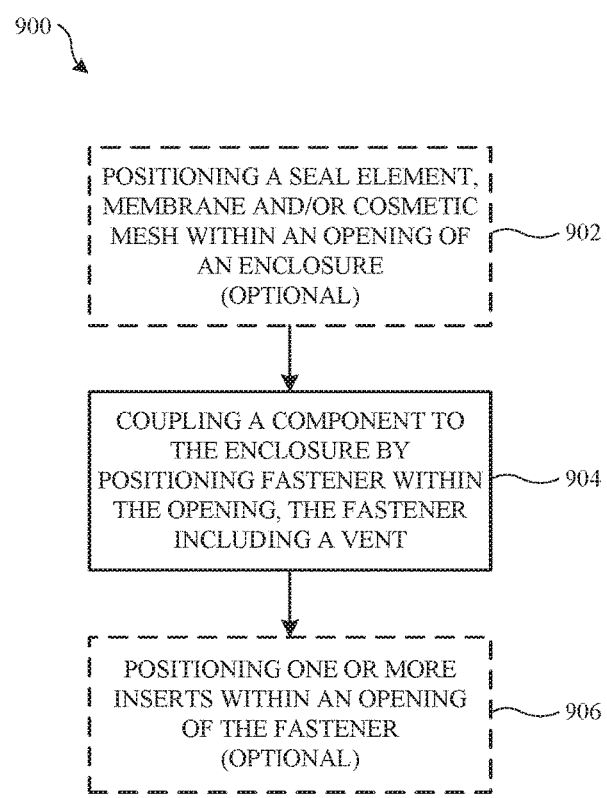
FIG. 9 shows a flowchart indicating a process for coupling a component to an enclosure using a vent fastener.

FIG. 9 illustrates flowchart 900 indicating a process for coupling a component to an enclosure using a vent fastener. At 902, a seal element, an air-permeable membrane and/or a cosmetic mesh are optionally positioned within an opening within an enclosure wall of the enclosure. The seal element can correspond to a compressible gasket, such as an O-ring, or may correspond to an adhesive or tape. The seal element can prevent liquid from entering between the enclosure wall and a subsequently positioned fastener. The air-permeable membrane can be a fine mesh that is designed to allow air pass but not liquid in any substantial amounts. In some embodiments, the air-permeable membrane is made of a hydrophobic material that wicks away water. The cosmetic mesh is optionally used to cover the air-permeable membrane from view of a user.

At 904, a component is coupled to the enclosure using a vent fastener. The vent fastener is positioned within the opening so as to secure the component to the enclosure wall. The vent fastener includes a vent that allows air to pass between an internal cavity of the enclosure and an external environment. If a compressible seal element is used, the fastener can also apply pressure to the seal element to create the liquid-tight seal. The air-permeable membrane, if used, can prevent liquid from entering into the internal cavity while allowing air to pass between the internal cavity and the external environment. The combined function of the fastener as a vent as well as a coupling member provides a compactness that allows more room within the internal cavity for more components. This may be especially important for very small portable electronic devices where maximizing space within the internal cavity can be of upmost importance. In addition, this configuration provides a modularization such that the fastener, seal element, air-permeable membrane and cosmetic cover can be easily removed and replaced during rework in the manufacturing process or during the service life of the electronic device.

At 906, one or more inserts are optionally positioned within an opening of the fastener. In some embodiments, the insert cooperates with the fastener to secure the component to the enclosure. In a particular embodiment, the insert engages with the component and the fastener such that the fastener does not directly engaged with the component. In this way, the fastener can apply a first pressure onto a seal element while the insert applies a second pressure, independent of the first pressure, onto the component to secure the component to the enclosure. The insert can have other functions. For example, the insert can include a sensor for detecting moisture, pressure of the external environment (e.g., for altimeter), and/or chemical agents (e.g., liquid or gas from external environment. Alternatively or additionally, the insert includes a through hole such that the insert can act as a vent to equalize pressure between the internal cavity and external environment.

Figure 10:
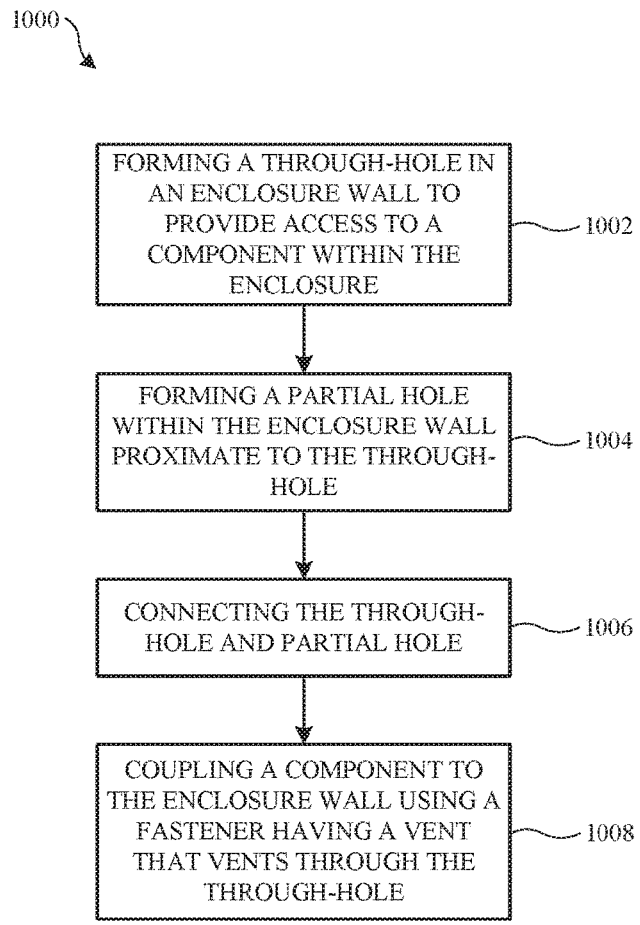
FIG. 10 shows a flowchart indicating a process for providing a hidden vent within an enclosure.

FIG. 10 illustrates flowchart 1000 indicating a process for providing a hidden vent within an enclosure for an electronic device. At 1002, a through-hole is formed within an enclosure wall to provide access to a component within an internal cavity of the enclosure. The through-hole can have any suitable shape and size. In some embodiments, multiple through-holes are provided. The component may be one that depends on access to the external environment. For example, the component can be a speaker than transmits sound through the through-hole to. The component can be a light emitter that transmits light through the through-hole. The component can be a sensor that detects pressure, sound, light, moisture or other information from the external environment.

At 1004, a partial hole is formed within the enclosure wall. The partial hole can be proximate to the through-hole so that the partial hole can be easily connected to the through-hole. The partial hole can have a shape and size for accommodating a vent fastener. In some embodiments, the partial hole is threaded in accordance with a threaded fastener. At 1006, the through-hole and the partial hole are connected. This can be accomplished, for example, by cutting away material of the enclosure wall between the through-hole and the partial hole. Alternatively, the partial hole can be positioned or angled such that a separate cut to connect the through-hole and partial hole is not needed. That is, forming the partial hole and connecting the through-hole and the partial hole are preformed in the same operation.

At 1008, a component is coupled to the enclosure using the vent fastener. The vent fastener is positioned within the partial hole such that the vent fastener engages with and secures the component to the enclosure. In some embodiments, one or more inserts are used to help secure the component to the enclosure. The vent fastener includes an opening such that an air pathway is formed from an internal cavity of the enclosure, through the vent fastener positioned within the partial hole, and through the through-hole to the external environment. Since the through-hole provides a dual function of providing access to both the component and the vent fastener, this reduces the number of visible openings within the enclosure that could otherwise reduce the integrity of the enclosure and/or impair the visual attractiveness and textual qualities of the enclosure.

Figure 11:
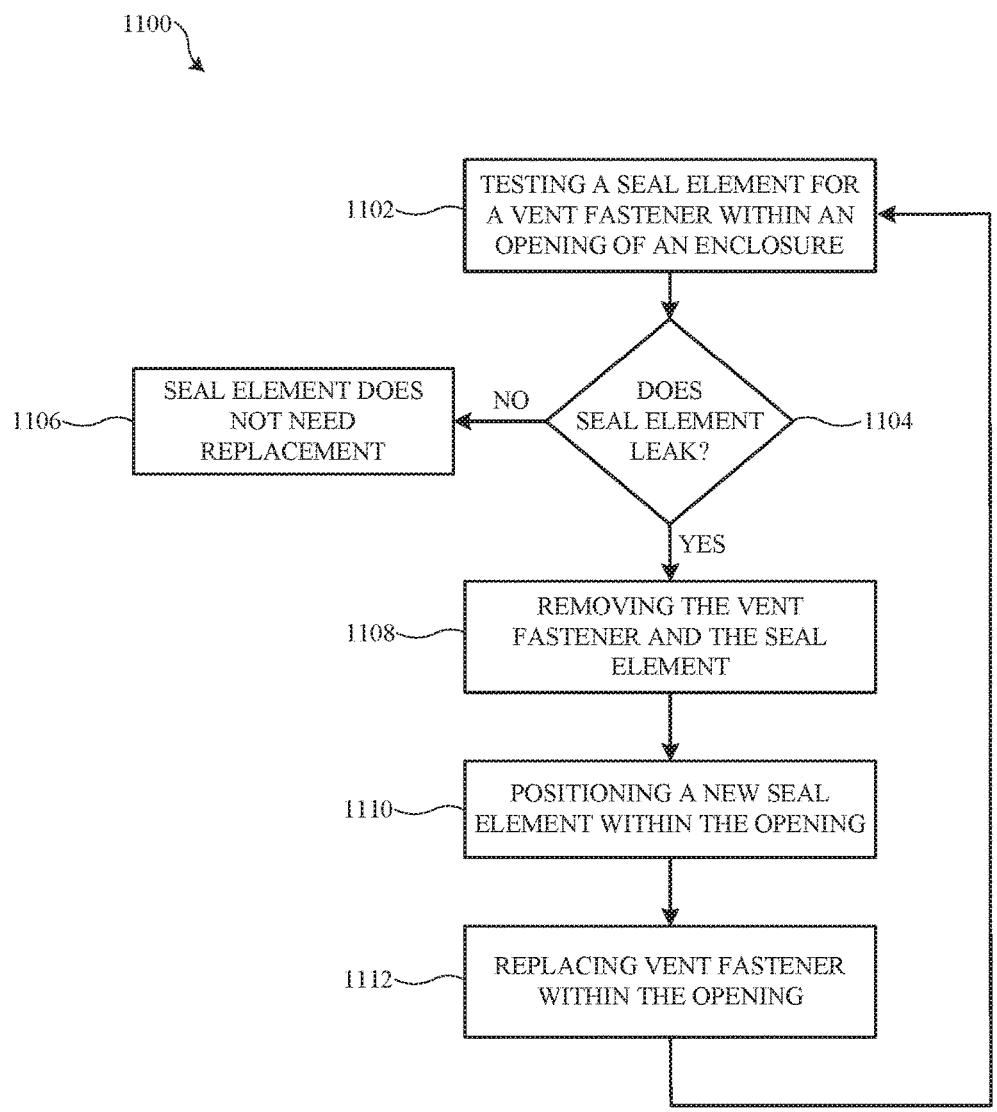
FIG. 11 shows a flowchart indicating a process for replacing a seal element and/or a vent fastener.

FIG. 11 illustrates flowchart 1100 indicating a process for replacing a seal element for a vent fastener within an enclosure. In some embodiments, the seal element should provide an airtight seal between the enclosure and the vent fastener, which is positioned within an opening of the enclosure. At 1102, the seal element is tested to determine whether the seal element leaks. The testing can include standard measurement techniques such as applying a pressure within the internal cavity of the enclosure and detecting evidence of a pressure leak at the seal element. At 1104, it is determined whether the seal element leaks. If the seal element does not leak, at 1106 the seal element does not need replacement.

If the seal element does leak, at 1108 the vent fastener and the seal element are removed from the opening of the enclosure. In some cases, an air-permeable membrane and cosmetic mesh are also removed. At 1110, a new seal element is positioned within the opening. In some cases, a new air-permeable membrane and cosmetic mesh are also positioned with the opening. At 1112, the vent fastener is replaced within the opening such that an adequate pressure is applied to the seal element to provide an airtight seal. In some cases, a new vent fastener is used. Returning to 1102, the seal element is tested again, and the process of flowchart 1100 is repeated until it is determined that the vent fastener is adequately sealed.

Note that the seal element and air-permeable membrane/cosmetic cover (if used) can be easily accessed and replaced by removal and replacement of the vent fastener. That is, the vent fastener is modularized for easy removal and replacement. This convenience can be important in the manufacturing line where fast rework is desired, or during the service life of the electronic device as the seal element, membrane and/or cosmetic cover experience wear and a user will desire easy maintenance.

Figure 12:
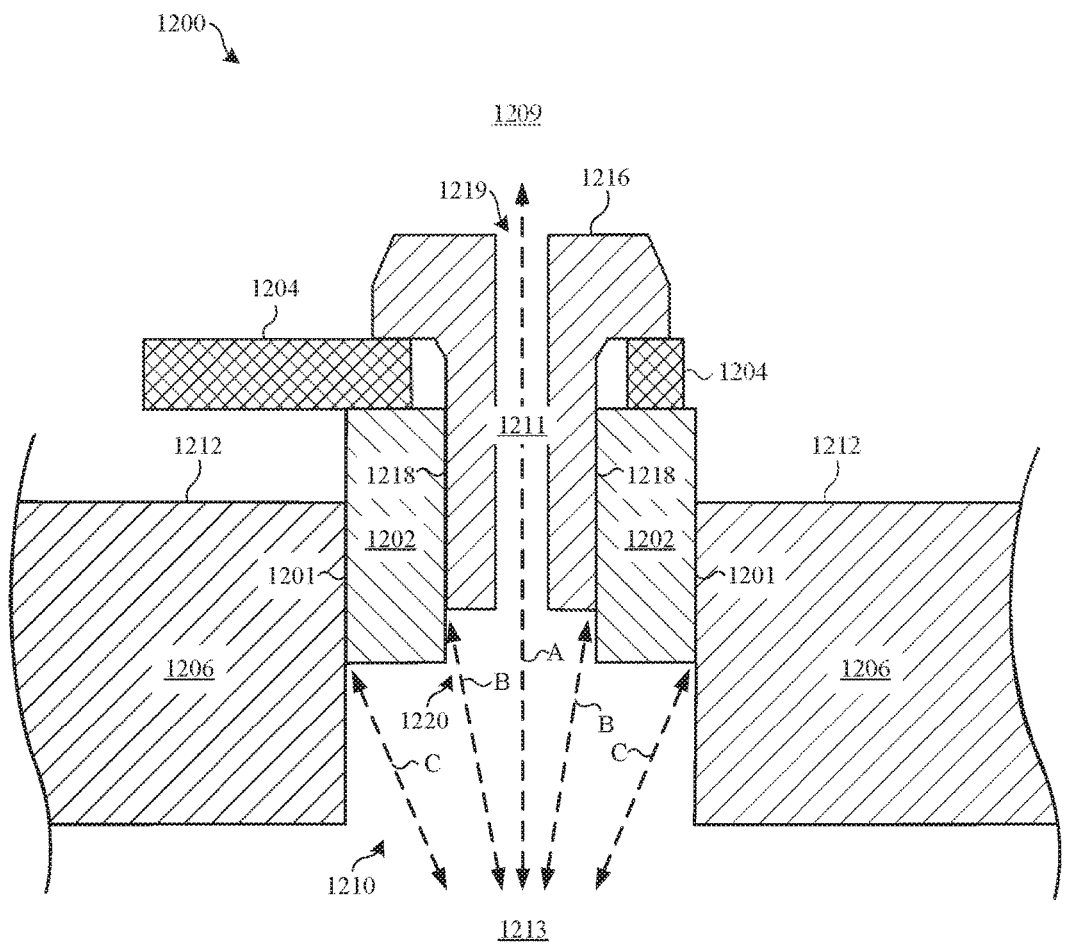
FIG. 12 shows a cross-section view of an enclosure that includes a vent fastener in accordance with some embodiments.

In some cases, any of the vent fasteners described above with reference to FIGS. 1-8D might not use to fasten a component to a housing wall, or the vent fasteners might be used to indirectly couple a component to a housing. Furthermore, air between the internal cavity of the enclosure and the external environment might occur via passages other than by the vent within the fastener. FIG. 12 is presented to illustrate some of these features, in accordance with some embodiments.

FIG. 12 illustrates a cross-section view of a portion of enclosure wall 1206 of electronic device 1200, which includes opening 1210 configured to accommodate fastener 1202 and insert 1216. Note that insert 1216 may also be referred to as a fastener while fastener 1202 may also be referred to as an insert or adapter. Insert 1216 is configured to fit within opening 1220 of fastener 1202, and engage with interior surface 1218 of fastener 1202. In some embodiments, insert 1216 includes external threads that engage with corresponding threads at interior surface 1218 of fastener 1202. In other embodiments, insert 1216 does not include threads and is press-fit or snap-fit within opening 1220 of fastener 1202. Fastener 1202 can be sized and shaped to fit within opening 1210 of enclosure wall 1206. In some embodiments, the external surface 1201 of fastener 1202, or a portion of the external surface 1201, includes threads that engage with corresponding threads at the interior surface of opening 1210 of enclosure wall 1206. In other embodiments, external surface 1201 does not include threads and is press-fit or snap-fit within opening 1210 of enclosure wall 1206.

Insert 1216 includes opening 1219 that cooperates with opening 1210 of fastener 1202 to create vent 1211. In this way, air can pass between external environment 1213 and internal cavity 1209 of the enclosure of electronic device 1200. This venting pathway is represented by arrow A. However, in some cases, air can also between external environment 1213 and internal cavity 1209 via spaces between insert 1216 and fastener 1202, represented by arrows B. Alternatively or additionally, in some cases, air can pass between external environment 1213 and internal cavity 1209 via spaces between fastener 1202 and enclosure wall 1206, represented by arrows C. If insert 1216 and/or fastener 1202 are threaded, the air may pass through these threaded passageways. In this way, passageways B and C can also act as vents for equalizing pressure between external environment 1213 and internal cavity 1209. These alternative venting passageways B and C can apply to suitable vent fastener systems described above with reference to FIGS. 1-6, and may be encouraged. For example, if insert 1216 is a device (e.g., device 626 at FIG. 626), venting passageways B and C can provide alternative ways of venting air. In other application, these alternative venting passageways B and C may be discouraged and are sealed in order to prevent passage of air. Note that for simplicity the vent fastener system of FIG. 12 does not show a seal element or membrane. In some embodiments, a seal element and/or a membrane are used, while in other embodiments a seal element and/or a membrane are not used.

As shown, component 1204 can be indirectly coupled to enclosure wall 1206. In particular, component 1204 can be coupled to enclosure wall 1206 without directly contacting interior surface 1212 of enclosure wall 1206. This can be accomplished, for example, by using fastener 1202 which protrudes a distance from interior surface 1212, thereby preventing component 1204 from directly contacting interior surface 1212. In other embodiments, fastener 1202 and insert 1216 are not used to couple any component to enclosure wall 1206. These alternative mechanisms of indirectly coupling a component, or not coupling a component at all, to an enclosure can apply to suitable vent fastener systems described above with reference to FIGS. 1-6.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. It will be apparent to one of ordinary skill in the art that many modifications and variations are possible in view of the above teachings.

What is claimed is:

1. An electronic device, comprising:
   an enclosure defining an internal cavity and having an opening that passes through a wall of the enclosure;
   a fastener comprising a first end external with respect to the opening and configured to couple a component to the enclosure, the fastener further comprising a second end opposite the first end and positioned in the opening, wherein the fastener defines a passageway for passage of air between the internal cavity and an external environment;
   a seal element positioned within the opening to form a liquid-tight seal between the fastener and the enclosure; and
   an air-permeable membrane positioned within the opening and engaged with the seal element, wherein air passing through the fastener passes through the air-permeable membrane.

2. The electronic device of claim 1, wherein the air-permeable membrane is coupled to the seal element.

3. The electronic device of claim 1, wherein the fastener includes a shaft having a vent, wherein the vent is defined by a vent opening configured to engage with an insert positioned within the vent opening.

4. The electronic device of claim 3, wherein the vent opening is defined by an interior surface that is threaded and configured to engage with corresponding threads of the insert.

5. The electronic device of claim 3, wherein the insert includes an insert opening that allows passage of air between the internal cavity and an external environment.

6. The electronic device of claim 3, wherein the insert includes a sensor that accesses the external environment.

7. The electronic device of claim 1, wherein the fastener comprises a flange configured to engage with and secure the component to the enclosure.

8. The electronic device of claim 1, wherein the seal element is coupled to the second end.

9. The electronic device of claim 8, wherein the air-permeable membrane is external with respect to the fastener.

10. A method of coupling a component to an enclosure for an electronic device, the method comprising:
    positioning a seal element within an opening of the enclosure, the opening formed through a wall of the enclosure;
    securing the component to the enclosure by a fastener, the fastener comprising i) a first end external with respect to the opening and ii) a second end opposite the first end and positioned in the opening, wherein the fastener applies a compression force on the seal element such that the seal element prevents entry of liquid to an internal cavity of the enclosure, wherein the fastener provides defines a passageway for air to pass between the internal cavity and an external environment; and
    positioning an air-permeable membrane within the opening, the air-permeable membrane engaged with and carrying the seal element, wherein air passing through the fastener passes through the air-permeable membrane.

11. The method of claim 10, further comprising:
    prior to positioning the fastener within the opening, positioning the air-permeable membrane within the opening, the membrane configured to prevent entry of liquid into the internal cavity from the external environment.

12. The method of claim 10, wherein the opening of the enclosure comprises a threaded opening, and an exterior surface of the fastener is threaded in accordance with the threaded opening, wherein positioning the fastener within the opening comprises twisting the fastener such that the fastener is screwed within the opening.

13. The method of claim 10, wherein positioning the fastener within the opening comprises press-fitting the fastener within the opening.

14. The method of claim 10, wherein the fastener includes a shaft having a vent, the vent defined by an interior surface of a vent opening within the fastener, the method further comprising:

positioning an insert within the vent.

15. The method of claim 14, wherein the insert cooperates with the fastener to secure the component to the enclosure.

16. An enclosure for an electronic device, the enclosure comprising:

a wall defining an internal cavity of the enclosure, the wall comprising:
  a through-hole that passes through an exterior surface and an interior surface of the wall, and
  a partial hole that passes through the interior surface and not through the exterior surface of the enclosure, wherein the through-hole and partial hole are connected by a channel that gives the partial hole access to an external environment; and
a fastener positioned within the partial hole, the fastener configured to secure a component to the wall, wherein the fastener provides a passageway for air to pass between the internal cavity and the external environment via the partial hole and the through hole.

17. The enclosure of claim 16, further comprising:

a compressible seal element that provides a liquid-tight seal between the fastener and the wall.

18. The enclosure of claim 17, wherein the fastener is configured to apply a force to the compressible seal element sufficient to provide the liquid-tight seal.

19. The enclosure of claim 18, further comprising:

an insert positioned within an opening of the fastener, wherein the insert cooperates with the fastener to secure the component to the wall, wherein the insert is configured to apply a second force to the component sufficient to secure the component to the wall, wherein the second force is different than the force applied to the compressible seal element.

20. The enclosure of claim 17, wherein the compressible seal element is positioned within the partial hole.

* * * * *